(12) United States Patent
Weaver et al.

(10) Patent No.: US 9,035,452 B2
(45) Date of Patent: May 19, 2015

(54) ELECTRONIC DEVICE COOLING WITH AUTONOMOUS FLUID ROUTING AND METHOD OF ASSEMBLY

(75) Inventors: Stanton Earl Weaver, Broadalbin, NY (US); Hendrik Pieter Jacobus De Bock, Clifton Park (NL)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 13/568,667

(22) Filed: Aug. 7, 2012

(65) Prior Publication Data

US 2014/0043764 A1  Feb. 13, 2014

(51) Int. Cl.
*H01L 23/473* (2006.01)
*H01L 23/38* (2006.01)
*B23P 15/26* (2006.01)

(52) U.S. Cl.
CPC ............... *B23P 15/26* (2013.01); *H01L 23/473* (2013.01); *H01L 2924/0002* (2013.01); *F28F 2260/02* (2013.01)

(58) Field of Classification Search
CPC ... H01L 27/16; H01L 23/473; H01L 23/3128; H01L 24/32; H01L 23/38; B23P 15/26; F28F 27/00
USPC ........................................................ 257/714
See application file for complete search history.

(56) References Cited

U.S. PATENT DOCUMENTS

| | | | |
|---|---|---|---|
| 5,099,311 A * | 3/1992 | Bonde et al. .................. 165/80.4 |
| 5,259,737 A | 11/1993 | Kamisuki et al. |
| 5,316,075 A * | 5/1994 | Quon et al. ................... 165/80.4 |
| 5,763,951 A | 6/1998 | Hamilton et al. |
| 5,801,442 A * | 9/1998 | Hamilton et al. ............. 257/714 |
| 5,901,037 A * | 5/1999 | Hamilton et al. ............. 361/699 |
| 6,704,200 B2 | 3/2004 | Zeighami et al. |
| 7,002,801 B2 | 2/2006 | Zeighami et al. |
| 7,104,312 B2 | 9/2006 | Goodson et al. |
| 7,265,978 B2 * | 9/2007 | Suzuki et al. .................. 361/699 |
| 7,334,630 B2 | 2/2008 | Goodson et al. |
| 7,436,059 B1 * | 10/2008 | Ouyang ........................ 257/712 |
| 7,515,415 B2 * | 4/2009 | Monfarad et al. ............ 361/699 |
| 7,969,734 B2 | 6/2011 | Arik et al. |

(Continued)

OTHER PUBLICATIONS

R. Vetury, et al., Polarization Induced 2DEG in MBE grown AlGaN/GaN HFETs: On the Origin, DC and RF Characterization, Mat. Res. Soc. Symp., 2000, pp. T2.5.1-T2.5.6, vol. 622, Materials Research Society.

(Continued)

*Primary Examiner* — Jarrett Stark
*Assistant Examiner* — Bitew Dinke
(74) *Attorney, Agent, or Firm* — Scott J. Asmus

(57) ABSTRACT

An integrated circuit device is provided. The integrated circuit device includes a die having a first surface and a second surface opposite the first surface. The die has at least one circuit element positioned on its first surface. At least one micro-channel is defined in the second surface of the die. The integrated circuit device includes a cooling substrate attached to the second surface of the die. At least one fluid routing channel is defined in the cooling substrate. The at least one fluid routing channel is connected to the at least one micro-channel defined in the die. Additionally, the cooling substrate has at least one valve positioned within the at least one fluid routing channel. The at least one valve is configured to autonomously regulate a flow rate of a cooling fluid flowing through the at least one fluid routing channel.

15 Claims, 7 Drawing Sheets

(56) References Cited

U.S. PATENT DOCUMENTS

| | | | |
|---|---|---|---|
| 2002/0075651 A1* | 6/2002 | Newton et al. | 361/700 |
| 2003/0002994 A1* | 1/2003 | Johnson et al. | 417/292 |
| 2004/0112585 A1* | 6/2004 | Goodson et al. | 165/299 |
| 2004/0113265 A1 | 6/2004 | DiBattista et al. | |
| 2004/0190251 A1* | 9/2004 | Prasher et al. | 361/699 |
| 2004/0206477 A1* | 10/2004 | Kenny et al. | 165/80.4 |
| 2005/0151244 A1* | 7/2005 | Chrysler et al. | 257/713 |
| 2006/0131737 A1* | 6/2006 | Im et al. | 257/717 |
| 2006/0180300 A1* | 8/2006 | Lenehan et al. | 165/247 |
| 2007/0063337 A1* | 3/2007 | Schubert et al. | 257/714 |
| 2007/0085198 A1* | 4/2007 | Shi et al. | 257/714 |
| 2007/0126103 A1* | 6/2007 | Shi | 257/686 |
| 2007/0230127 A1* | 10/2007 | Peugh et al. | 361/699 |
| 2007/0256810 A1* | 11/2007 | Di Stefano et al. | 165/46 |
| 2008/0156462 A1* | 7/2008 | Arik et al. | 165/80.4 |
| 2008/0265406 A1* | 10/2008 | Andry et al. | 257/713 |
| 2009/0057879 A1* | 3/2009 | Garrou et al. | 257/713 |
| 2009/0057881 A1* | 3/2009 | Arana et al. | 257/714 |
| 2010/0171213 A1* | 7/2010 | Hisano et al. | 257/714 |
| 2012/0228779 A1* | 9/2012 | King, Jr. et al. | 257/774 |
| 2012/0296379 A1* | 11/2012 | Morancy-Meister et al. | 606/249 |

OTHER PUBLICATIONS

A.N. Smith and J.P. Calame, Impact of Thin Film Thermophysical Properties on Thermal Management of Wide Bandgap Solid-State Transistors, International Journal of Thermophysics, 2004, pp. 409-422, vol. 25, No. 2, Plenum Publishing Corporation.

I.P. Smorchkova, et al., Polarization-Induced Charge and Electron Mobility in AlGaN/GaN Heterostructures Grown by Plasma-Assisted Molecular-Beam Epitaxy, Journal of Applied Physics, 1999, pp. 4520-4526, vol. 86, No. 8, American Institute of Physics.

RF3934 120W GaN Wideband Power Amplifier, RFMD, 2012, pp. 1-14.

CGHV1J070D, 70 W, 18.0 GHz, GaN HEMT Die, CREE, 2012, pp. 1-9.

CGH60060D, 60 W, 6.0 GHz, GaN HEMT Die, CREE 2012, pp. 1-7.

Ambacher et al., Two Dimensional Electron Gases Induced by Spontaneous and Piezoelectric Polarization in Undoped and Doped AlGaN/GaN heterostructures, The Smithsonian/NASA Astrophysics Data System, pp. 334-344, vol. 87, Issue 1, 2000.

Singhal et al., "Microscale Pumping Technologies for Microchannel Cooling Systems", ASME—Applied Mechanics Reviews, pp. 1-31, vol. 57, Issue 3, May 2004.

Garg et al., "Micro Fluidic Jets for Thermal Management of Electronics", ASME Conference Proceedings, vol. 4, 2004.

Shekarriz, "Fixed Valve Piezoelectric Micropump for Miniature Thermal Management Module", ASME Fluids Engineering Division Summer Meeting and Exhibition, pp. 1-31, Jul. 2006.

Sarua et al., "Thermal Boundary Resistance Between GaN and Substrate in AlGaN/GaN Electronic Devices", IEEE Transactions of Electron Devices, pp. 3152-3158, vol. 54, Issue 12, Dec. 2007.

Park et al., "Friction Factor and Heat Transfer in Multiple Microchannels with Uniform Flow Distribution", International Journal of Heat and Mass Transfer, pp. 4535-4543, vol. 51, Issues 17-18, Aug. 2008.

"CMPA2735075F 75 W, 2.7-3.5 GHz, GaN MMIC, Power Amplifier", Cree, 2010.

Weaver, "DARPA Near Junction Thermal Transport—Hermetic, Micro-channel, Autonomously Liquid Cooled GaN PA Module," DARPA TMT Program Review Meeting, Nov. 29-Dec 2, 2011, p. 1, Orlando, Florida.

* cited by examiner

US 9,035,452 B2

ELECTRONIC DEVICE COOLING WITH AUTONOMOUS FLUID ROUTING AND METHOD OF ASSEMBLY

STATEMENT REGARDING FEDERALLY SPONSORED RESEARCH & DEVELOPMENT

This invention was made with Government support under contract number N66001-12-C-4185 awarded by the Defense Advanced Research Projects Agency (DARPA). The Government has certain rights in the invention.

BACKGROUND

The subject matter disclosed herein relates generally to cooling electronic devices and, more particularly, to methods and apparatus for dissipating heat from an integrated circuit device.

In at least some known electronic systems, e.g., computers, radios, radar modules, etc., the electronic device is the warmest component in the system. As such, at least some known electronic devices are coupled to a heat removal system to dissipate heat generated by the electronic device. Many known heat removal systems for such electronic devices include a path for heat flow with a high thermal resistance resulting in a high operating junction temperature. Generally, waste heat is removed by conduction, spreading, and convection to an appropriate cooling fluid with gradual reductions in temperature as the heat moves from the heat source to the cooling fluid. For example, the heat generated by a high-density power integrated circuit ("IC") device may travel from the front side of the IC device trough the IC substrate, a thermal interface material, a heat spreader, and a heat sink before being transferred to a cooling fluid, e.g., air.

While considerable efforts have been made to develop heat removal systems that are reliable and efficient, these systems often only address the backside cooling of the electrical devices. In at least some known high-density power IC devices, e.g., IC amplifiers, the thermal resistance associated with the junction region on the front side of the IC die can be as large as the thermal resistance for the remaining components of the heat removal system. In at least some known IC devices, this junction region may typically include the first 100 microns of the IC device, often including an epitaxial layer of several microns coupled to a ceramic substrate, e.g., silicon, silicon carbide, etc.

BRIEF DESCRIPTION

In one aspect, an integrated circuit device is provided. The integrated circuit device includes a die with a first surface and a second surface opposite the first surface. The die includes at least one circuit element positioned on the first surface. The integrated circuit device also includes at least one micro-channel defined in the second surface of the die. Additionally, the integrated circuit device includes a cooling substrate attached to the second surface of the die. The cooling substrate includes at least one fluid routing channel connected to the at least one micro-channel, and at least one valve positioned within the at least one fluid routing channel. At least one valve is configured to autonomously regulate a flow rate of a cooling fluid flowing through the at least one fluid routing channel.

In another aspect, a cooling system for an integrated circuit device is provided. The cooling system includes at least one micro-channel defined in a die. In addition, the cooling system includes a cooling substrate attached to the die. The cooling substrate includes at least one fluid routing channel connected to the at least one micro-channel, and at least one temperature-responsive valve positioned within the at least one fluid routing channel. The at least one temperature-responsive valve is configured to autonomously regulate a flow rate of a cooling fluid flowing through the at least one fluid routing channel. Furthermore, the cooling system includes a fluid circulation pump fluidly attached to the at least one fluid routing channel. The fluid circulation pump is attached to the cooling substrate. The cooling system may also include a glass substrate attached to the cooling substrate, and a heat exchanger that includes at least one cooling channel fluidly connected to the at least one fluid routing channel and the fluid circulation pump. The heat exchanger may be attached to the glass substrate.

In another aspect, a method includes providing a die with a first surface and a second surface opposite the first surface. The die includes at least one circuit element positioned on the first surface. The method also includes forming at least one micro-channel in the second surface of the die to allow flow of a cooling fluid. The method includes coupling the die to a cooling substrate that has at least one fluid routing channel formed within the cooling substrate for receiving the cooling fluid. The method also includes coupling the die such that the at least one micro-channel is in flow communication with the at least one fluid routing channel. The method further includes positioning at least one temperature-responsive valve within the at least one fluid routing channel and configuring the at least one temperature-responsive valve to autonomously regulate the flow rate of the cooling fluid flowing through the at least one fluid routing channel.

DRAWINGS

Although specific features of various embodiments may be shown in some drawings and not in others, this is for convenience only. Any feature of any drawing may be referenced and/or claimed in combination with any feature of any other drawing.

DETAILED DESCRIPTION

The apparatus, systems, and methods described herein relate to cooling integrated circuit devices. A cooling module assembly includes a die with a plurality of micro-channels defined in a backside surface of the die. Additionally, the cooling module assembly includes a cooling substrate coupled to the backside of the die including an input manifold in fluid communication with a plurality of inlet channels, which are in fluid communication with the plurality of micro-channels, and an output manifold in fluid communication with the exit channels of the plurality of micro-channels.

Furthermore, the cooling module assembly includes a heat exchanger in fluid communication with the output manifold, and a fluid circulation pump in fluid communication with the heat exchanger and the input manifold. One or more temperature-responsive valves are positioned within the exit channels of the plurality of micro-channels to regulate autonomously the flow rate of a cooling fluid flowing through the cooling module assembly. During operation, heat is transferred from the junction region of the die to the cooling fluid flowing through the micro-channels. The cooling fluid transfers the heat received from the junction region of the die to the heat exchanger then the cooling fluid is recirculated and pumped through the micro-channels in a hermetically sealed closed-loop autonomous cooling circuit.

Water is an effective cooling fluid because it provides a high convection heat transfer coefficient and a high specific heat. Water, however, is subject to freezing. In one embodiment, a mixture of ethylene-glycol and water or propylene-glycol and water, where the percentage of ethylene-glycol or propylene-glycol may be less than 60%, may be used because of the mixture's anti-freezing and corrosion inhibiting properties. In an alternative embodiment, a dielectric fluid may be used.

Figure 1:
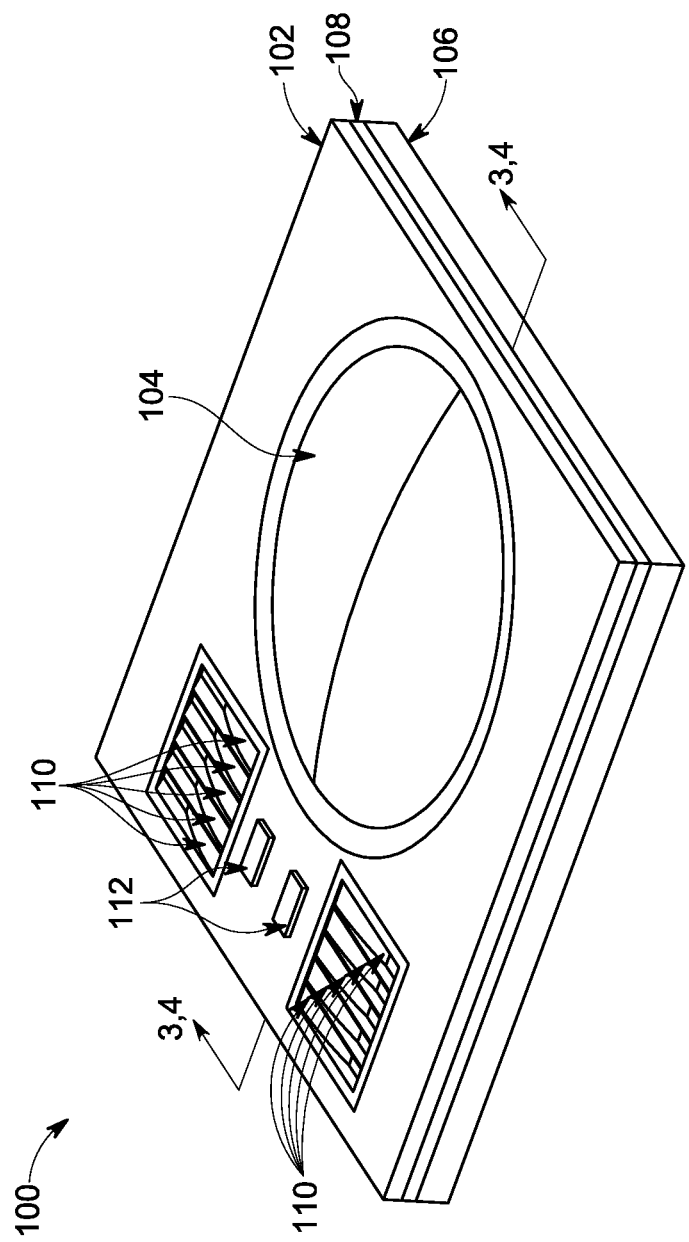
FIG. 1 illustrates a perspective view of an exemplary integrated circuit device including the cooling module assembly.

FIG. 1 illustrates a perspective view of an exemplary integrated circuit device 100 including the cooling module assembly. Integrated circuit device 100 includes die 112 (also known as an IC die) including backside micro-channels (Shown in FIG. 2), cooling substrate 102, fluid circulation pump 104, heat exchanger 106, glass substrate 108, and valves 110 (also known as temperature-responsive valves) connected in a hermetically-sealed closed-loop autonomous cooling circuit. IC die 112 is coupled to cooling substrate 102 where its circuit elements are on the surface opposite cooling substrate 102. As used herein, the term "die" or "IC die" refers to an object that affects electrons or their associated fields and generates heat as a by-product of its operation. Examples of IC dies include, but are limited to, semiconductors, microprocessors, digital signal processors, graphics processing units, diodes, transistors, or any other suitable heat-generating devices. In the exemplary embodiment, IC die 112 is a gallium nitride ("GaN") high-electron mobility transistor device, including an epitaxial layer of several micrometers of GaN attached to a silicon carbide ("SiC") substrate. Alternatively, IC die 112 may be any object that enables integrated circuit device 100 to function as described herein.

In the exemplary embodiment, a plurality of IC dies 112 are coupled to cooling substrate 102 to form integrated circuit device 100. Any quantity of IC dies 112, however, may be coupled to cooling substrate 102 that enables integrated circuit device 100 to function as described herein.

In the exemplary embodiment, cooling substrate 102 is coupled to IC die 112 using any suitable fastening mechanism that enables cooling substrate 102 or IC die 112 to function as described herein. For example, in the exemplary embodiment, cooling substrate 102 and IC die 112 are soldered together using a eutectic metal alloy, e.g., gold-tin ("Au—Sn"). In the exemplary embodiment, the use of the eutectic metal alloy enables cooling substrate 102 and IC die 112 to be coupled forming a hermetic seal therebetween. Alternatively, the solder material may include any suitable material or composition that enables cooling substrate 102 or IC die 112 to function as described herein.

To facilitate mitigating stresses resulting from thermal expansion between cooling substrate 102 and IC die 112, in the exemplary embodiment, cooling substrate 102 may be fabricated from silicon, a material having a coefficient of thermal expansion ("CTE") similar to that of the SiC substrate of IC die 112. Alternatively, in another embodiment, cooling substrate 102 may be fabricated from copper alloys of molybdenum and tungsten, etc., or any other suitable material or composition that enables cooling substrate 102 and IC die 112 to function as described herein.

Figure 2:
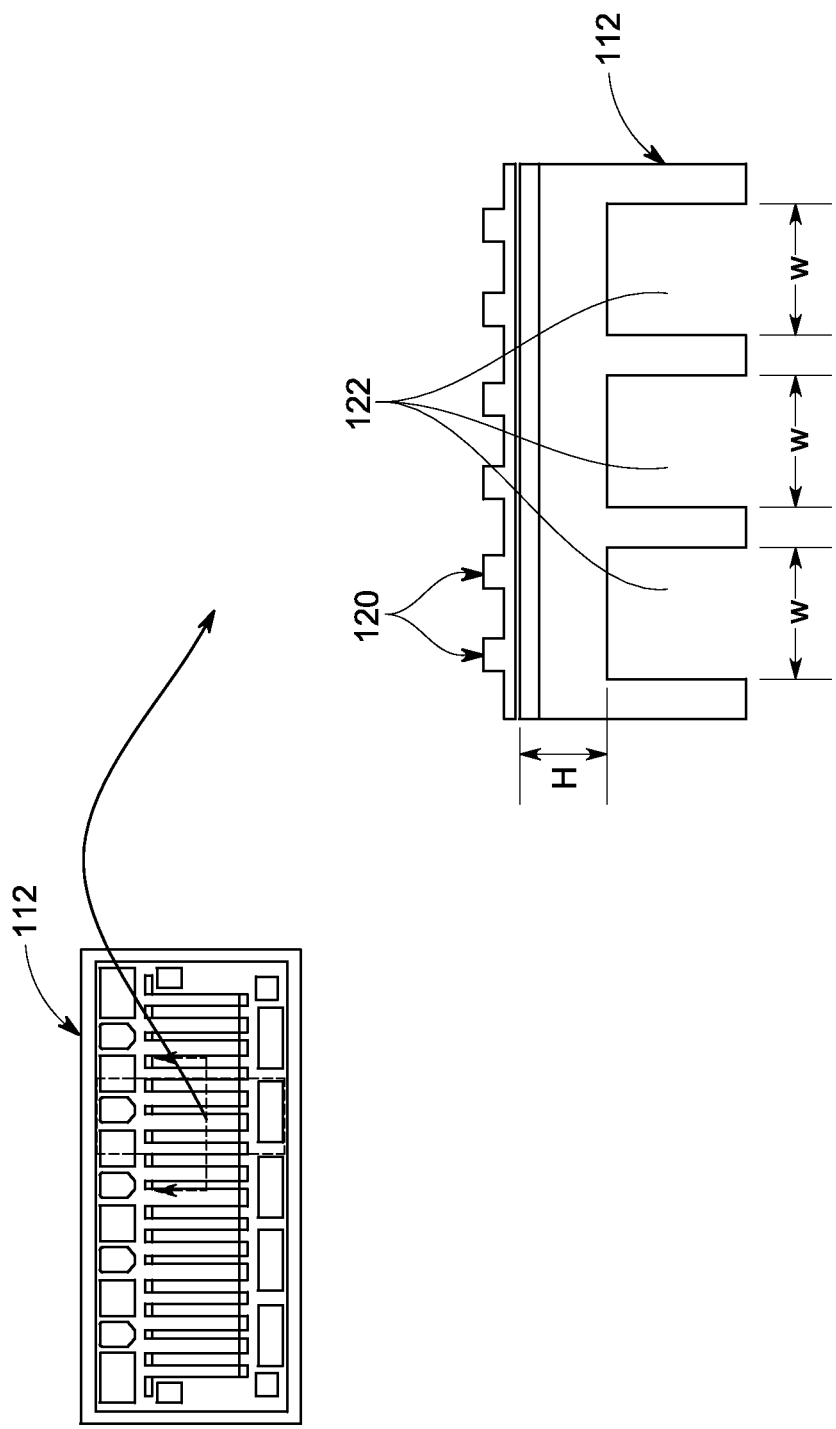
FIG. 2 is a section view of the integrated circuit die illustrating an end view of a plurality of backside micro-channels.
Figure 3:
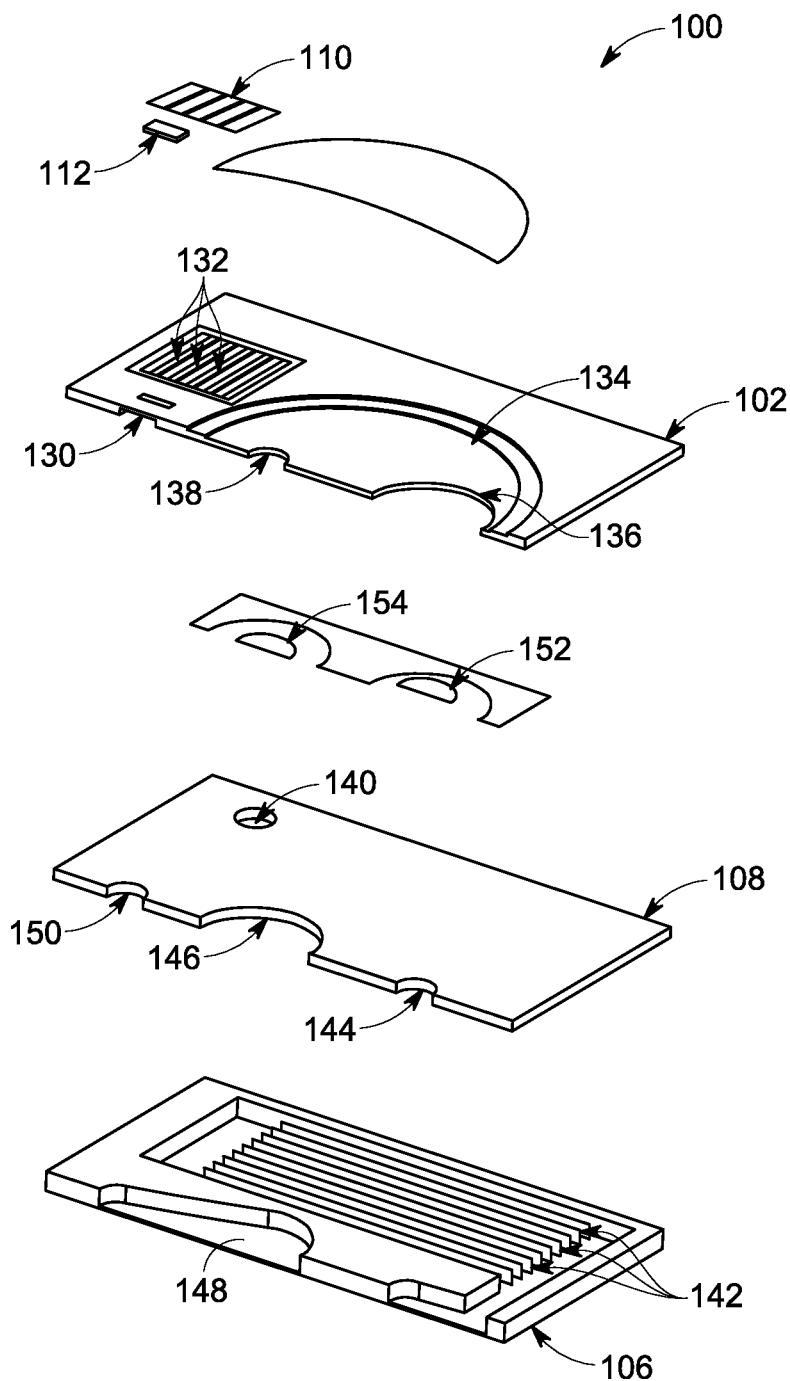
FIG. 3 is an exploded section view of the integrated circuit device shown in FIG. 1.
Figure 6:
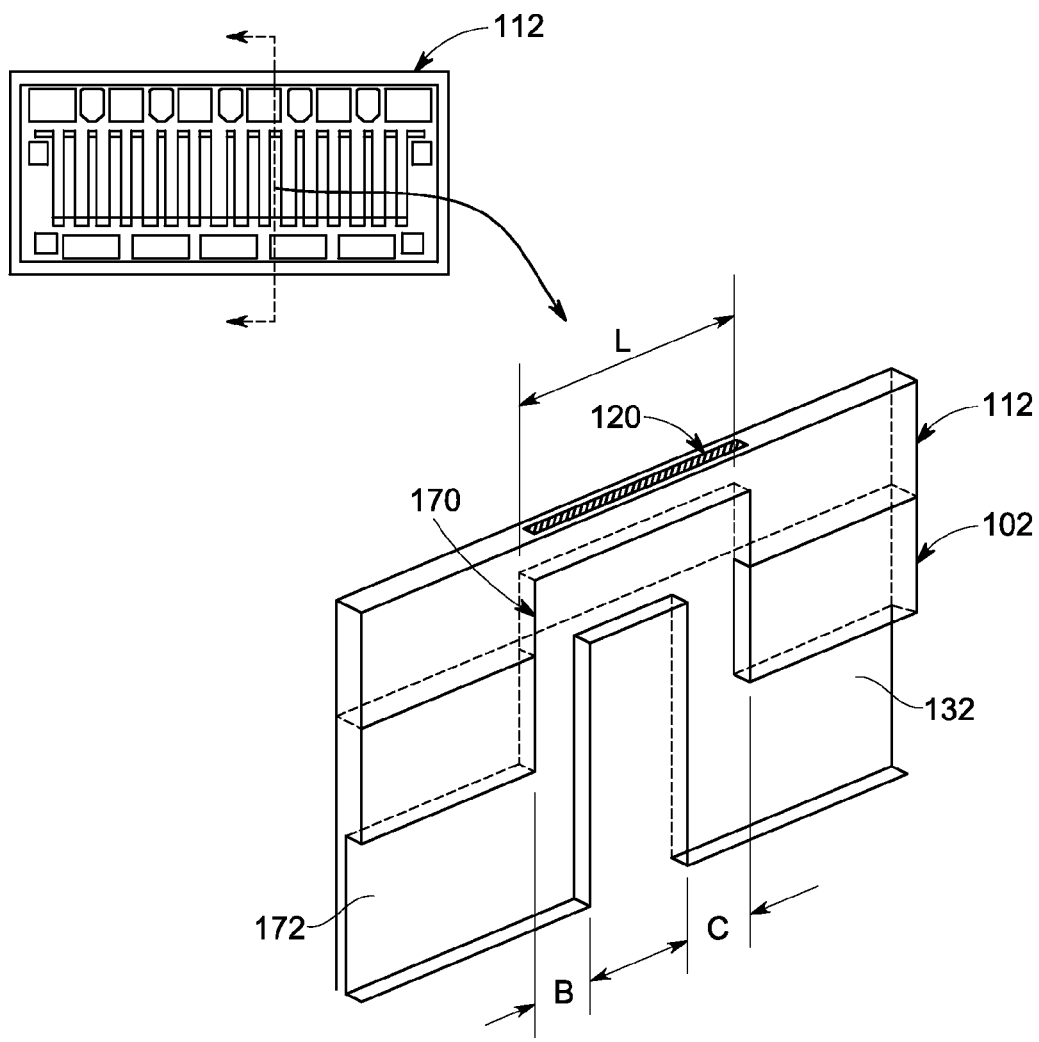
FIG. 6 is a section view of the integrated circuit die illustrating an edge view of a single backside micro-channel.

FIG. 2 is a section view of the IC die 112 illustrating an end view of a plurality of backside micro-channels 122. As shown, IC die 112 includes a plurality of circuit elements, or gates 120 on its front surface. Additionally, IC die 112 includes backside micro-channels 122 (described in detail below) for conducting the cooling fluid therethrough to absorb or dissipate heat generated at the junction region of IC die 112 by gates 120. In the exemplary embodiment, micro-channels 122 terminate above respective inlet channels 172 and at respective fluid routing channels 132 as shown in FIGS. 3 and 6. Cooling substrate 102 is coupled to IC die 112 such that the cooling fluid entering micro-channels 122 is prevented from transferring to adjacent micro-channels 122. A micro-channel, as that term is used herein, is a small groove or channel defined in the die substrate that functions to circulate, or channel, a cooling fluid therethrough. A micro-channel typically has at least one of its cross-sectional dimensions measuring less than 1 millimeter.

FIG. 3 is an exploded section view of integrated circuit device 100 shown in FIG. 1. In the exemplary embodiment, cooling substrate 102 includes an input manifold 130 formed therein for channeling a cooling fluid from fluid circulation pump 104 to inlet channels 172 (Shown in FIG. 6). Inlet channels 172 circulate the cooling fluid to backside micro-channels 122 (Shown in FIG. 2) of IC die 112. The heated cooling fluid is then channeled through a plurality of fluid routing channels 132 then through valves 110 which are positioned within fluid routing channels 132 (As shown in FIG. 1). After flowing through valves 110, the cooling fluid is channeled to an output manifold (not shown) for passage to heat exchanger 106.

Furthermore, in the exemplary embodiment, cooling substrate 102 defines pump cavity 134. Defined within pump cavity 134 is pump inlet port 136 and pump outlet port 138 for channeling the cooling fluid through fluid circulation pump 104 (Shown in FIG. 1). Inlet check valve 152 is provided between inlet aperture 144 and pump cavity 134 and outlet check valve 154 is provided between pump cavity 134 and outlet aperture 146.

As shown in the exemplary embodiment, glass substrate 108 includes an output port 140 for circulating the cooling fluid from the output manifold of cooling substrate 102 to heat exchanger 106. As shown in FIG. 2, the cooling fluid is circulated through heat exchanger 106 via a plurality of cooling channels 142 formed in the top surface of heat exchanger 106. However, heat exchanger 106 may use any configuration that enables heat exchanger 106 to function as described herein, including, but not limited to, offset strip fin or pin fin configurations. From heat exchanger 106, the cooling fluid is circulated through inlet aperture 144 and routed to inlet check valve 152 and pump inlet port 136. After passing through inlet check valve 152 and pump inlet port 136, the cooling fluid is pressurized by fluid circulation pump 104 and circulated through pump outlet port 138 and outlet check valve 154 then through outlet aperture 146 to chamber 148 formed in the top surface of heat exchanger 106. The cooling fluid is subsequently circulated to input manifold 130 through inlet port 150.

In the exemplary embodiment, glass substrate 108 is coupled to cooling substrate 102 using any suitable fastening mechanism that enables glass substrate 108 and cooling substrate 102 to function as described herein. For example, in the exemplary embodiment, glass substrate 108 and cooling substrate 102 are bonded using anodic bonding, and are held together by an electrostatic field. In the exemplary embodiment, the use of anodic bonding enables glass substrate 108 and cooling substrate 102 to be coupled forming a hermetic seal therebetween. In another embodiment, glass substrate 108 and cooling substrate 102 are soldered together using a eutectic metal alloy, e.g., gold-tin ("Au—Sn"). In another embodiment, the solder material includes any suitable material or composition that enables glass substrate 108 and cooling substrate 102 to function as described herein.

In the exemplary embodiment, to facilitate mitigating stresses resulting from thermal expansion between glass substrate 108 and cooling substrate 102 and to facilitate the anodic bonding process, glass substrate 108 is fabricated from borosilicate glass. Borosilicate glass has a CTE similar to that of cooling substrate 102, which in the exemplary embodiment is fabricated from silicon. In another embodiment, glass substrate 108 is fabricated from copper alloys of molybdenum and tungsten, etc., or any other suitable material or composition that enables glass substrate 108 and cooling substrate 102 to function as described herein.

Furthermore, in the exemplary embodiment, glass substrate 108 is coupled to heat exchanger 106 using any suitable fastening mechanism that enables glass substrate 108 and heat exchanger 106 to function as described herein. For example, in the exemplary embodiment, glass substrate 108 and heat exchanger 106 are bonded using anodic bonding to facilitate glass substrate 108 and heat exchanger 106 being coupled and having a hermetic seal formed therebetween. In another embodiment, glass substrate 108 and heat exchanger 106 are soldered together using a eutectic metal alloy, e.g., gold-tin ("Au—Sn"). In another embodiment, the solder material includes any suitable material or composition that enables glass substrate 108 and cooling substrate 102 to function as described herein.

In the exemplary embodiment, to facilitate mitigating stresses resulting from thermal expansion between glass substrate 108 and heat exchanger 106 and to facilitate the anodic bonding process, heat exchanger 106 is fabricated from silicon, a material having a CTE similar to that of glass substrate 108. In another embodiment, heat exchanger 106 is fabricated from copper alloys of molybdenum and tungsten, etc., or any other suitable material or composition that enables glass substrate 108 and heat exchanger 106 to function as described herein.

Figure 4:
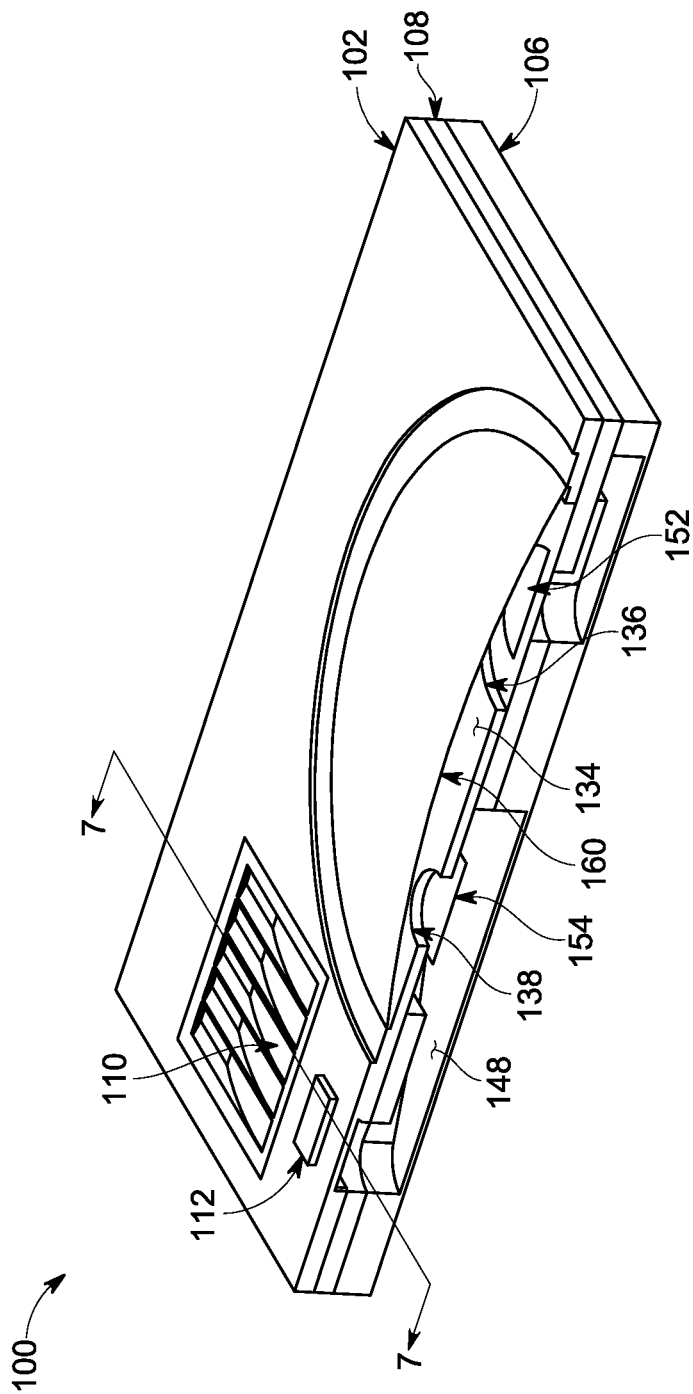
FIG. 4 illustrates a section view of the integrated circuit device shown in FIG. 1.

FIG. 4 illustrates a section view of integrated circuit device 100 shown in FIG. 1. In the exemplary embodiment, fluid circulation pump 104 is a piezoelectric diaphragm pump. However, fluid circulation pump 104 may be any type of pump that enables fluid circulation pump 104 to function as described herein. In the exemplary embodiment, fluid circulation pump 104 has a flow rate capability that ranges between 50 milliliters per minute ("ml/min") and 200 ml/min and a pressure capability that ranges between 50 kilopascal ("kPa"), and 200 kPa.

In the exemplary embodiment, fluid circulation pump 104 is coupled to cooling substrate 102 using any suitable fastening mechanism that enables fluid circulation pump 104 and cooling substrate 102 to function as described herein. In one embodiment, the piezo component (not shown) is mounted to a metallic shim to form pump diaphragm 160 for fluid circulation pump 104. Furthermore, pump diaphragm 160 is hermetically sealed in pump cavity 134 utilizing hermetic sealing methods including, but not limited to, soldering, brazing, welding, or glass frit bonding. In an embodiment where hermeticity is not necessary, an edge seal, including, but not limited to, a silicone, epoxy, or polymer edge seal, may be used to seal pump diaphragm 160 in pump cavity 134, and to provide a reliable, high temperature, liquid seal that provides the flexure point for pump diaphragm 160.

In one embodiment, pump inlet port 136 and pump outlet port 138 are defined within pump cavity 134. Inlet check valve 152 is positioned between inlet aperture 144 and pump inlet port 136 where it allows the cooling fluid circulating from heat exchanger 106 to enter pump cavity 134 but does not allow the cooling fluid to exit pump cavity 134 through inlet check valve 152. Outlet check valve 154 is positioned between pump outlet port 138 and outlet aperture 146. Outlet check valve 154 allows the cooling fluid circulating from pump cavity 134 to enter chamber 148 but does not allow the cooling fluid to reverse flow and enter pump cavity 134 through outlet check valve 154.

In the exemplary embodiment, an alternating current is provided to the piezo component (not shown), which vibrates pump diaphragm 160 and generates a pumping action. When pump diaphragm 160 is moving away from pump cavity 134, inlet check valve 152 is opened and outlet check valve 154 is closed, so that the cooling fluid enters pump cavity 134 through pump inlet port 136. Alternatively, when pump diaphragm 160 is moving toward pump cavity 134, inlet check valve 152 is closed and outlet check valve 154 is opened, so that the cooling fluid exits pump cavity 134 through pump outlet port 138.

Referring back to FIG. 2, micro-channels 122 have a substantially equal width "W" and a substantially equal distance "H" from gates 120. Micro-channels 122 have a width "W" in the range between about 50 microns and about 175 microns. Additionally, micro-channels 122 have a distance "H" from gates 120 in the range between about 2 microns and about 60 microns. If micro-channels 122 are positioned too closely to the junction region of IC die 112, the heat fluxes on the walls of micro-channel 122 will be very high locally below the gates 120 as shown in FIG. 6.

Figure 5:
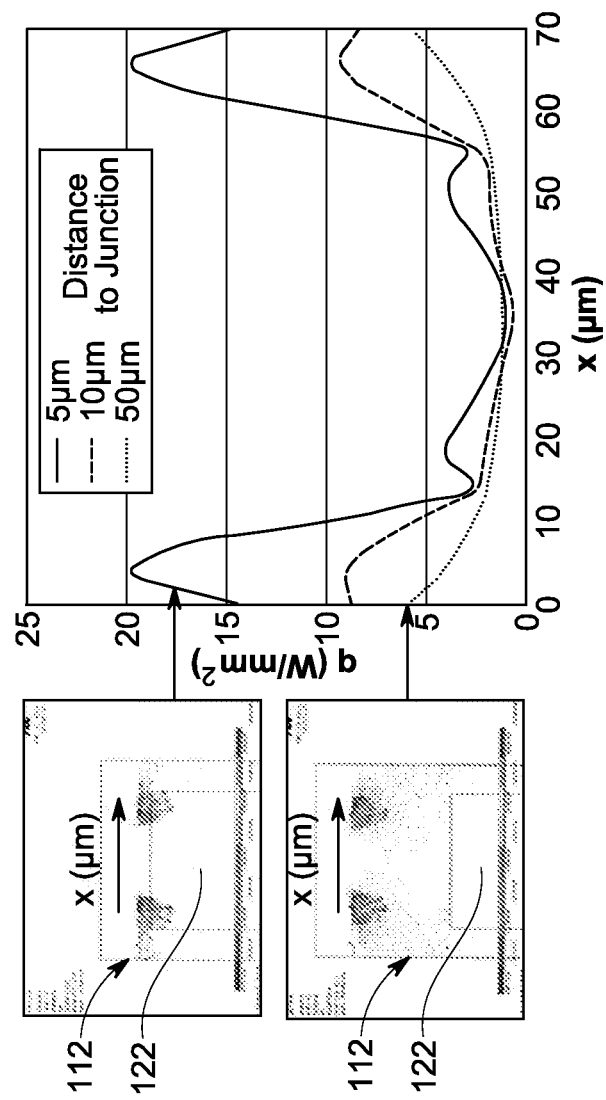
FIG. 5 illustrates the heat flux distribution on the top surface of the micro-channels.

FIG. 5 illustrates the heat flux distribution on the top surface of micro-channel 122. FIG. 5 shows that if micro-channel 122 is positioned at about 50 microns below the junction region of IC die 112, the maximum heat flux values may be reduced to approximately one quarter the maximum heat flux value where micro-channel 122 is positioned at about 5 microns below the junction region. To prevent nucleation within the cooling fluid flowing through micro-channels 122, it is preferred to keep heat flux values below 10 watts per square millimeter ("W/mm$^2$") at the micro-channel walls.

In the exemplary embodiment, each micro-channel 122 is configured to dissipate heat from two gates 120 of IC die 112. In another embodiment, each micro-channel 122 is configured to dissipate heat from three gates 120 of IC die 112. In another embodiment, each micro-channel 122 is configured to dissipate heat from four gates 120 of IC die 112. However, micro-channels 122 may be configured to remove heat from any number of gates.

FIG. 6 is a section view of the IC die 112 illustrating an edge view of a single backside micro-channel 122. As described above, IC die 112 includes a plurality of gates 120 on its front surface. Micro-channels 122 are positioned below gates 120 with input edge 170 of micro-channels 122 substantially aligned with the edge of gates 120. Micro-channels 122 have a substantially equal channel length "L." Micro-channels 122 have a channel length "L" in the range between about 350 microns and about 600 microns. As shown, input manifold 130, defined in cooling substrate 102, defines a plurality of inlet channels 172 having an inlet width "B" for micro-channels 122. Inlet width "B" has a range between about 40 microns and about 110 microns. Fluid routing channels 132 define the outlet width "C" for micro-channels 122. In the exemplary embodiment, outlet width "C" may be oversized to reduce the pressure drop of the working fluid in the closed-loop system. Outlet width "C" has a range between about 100 microns and about 200 microns.

Figure 7:
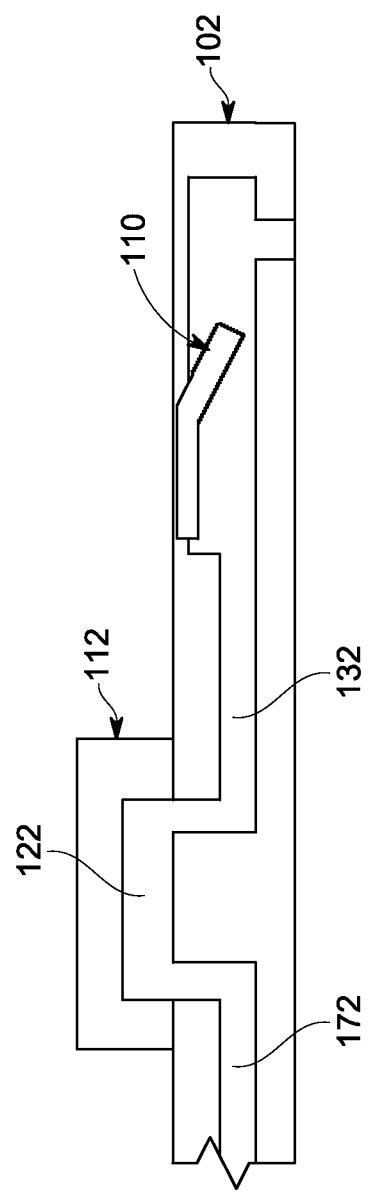
FIG. 7 is a section view of the integrated circuit device illustrating the position of a valve within a fluid routing channel.

FIG. 7 is a section view of integrated circuit device 100 illustrating the position of a valve 110 within a fluid routing channel 132. The position of valves 110 is used to regulate autonomously the flow rate of the cooling fluid through fluid routing channels 132. Valves 110 are coupled to cooling substrate 102. As shown in FIGS. 3 and 7, valves 110 are positioned within fluid routing channels 132 and defined in a partially opened position for restricting the flow of the cooling fluid therethrough. The partially opened position of valves 110 is referred to as being the default partially opened curved position. One valve 110 is positioned in each fluid routing channel 132. Although valves 110 in FIG. 3 are all shown to be partially opened, each valve 110 alternatively expands or contracts independently of each other.

In the exemplary embodiment, valves 110, also known as temperature-responsive valves, are fabricated from a shape memory alloy that senses a temperature difference in the cooling fluid and automatically opens or closes in response to the temperature difference. In one embodiment, temperature-responsive valves 110 are configured to open and close at specific temperatures depending on their design. Additionally, temperature-responsive valves 110 actuate without an additional control system, autonomously regulating the flow of the cooling fluid. In another embodiment, valves 110 are made of a temperature sensitive bi-material that senses a temperature difference and actuates in response to the temperature difference.

In operation, during normal conditions, temperature-responsive valves 110 are in their default partially opened curved position. However, as the temperature of the cooling fluid rises, temperature-responsive valves 110 actuate to regulate the amount of cooling fluid flowing through temperature-responsive valves 110. In the exemplary embodiment, temperature-responsive valves 110 expand by straightening. In another embodiment, temperature-responsive valves 110 are configured to contract, further limiting the amount of cooling fluid circulating through temperature-responsive valves 110.

In the exemplary embodiment, the autonomous cooling flow regulation in fluid routing channels 132 facilitates reducing hotspots in IC die 112. Additionally, autonomous cooling flow regulation increases the reliability of integrated circuit device 100 by improving temperature uniformity and reducing thermal stresses. Furthermore, temperature-responsive valves 110 may prevent or reduce thermal runaway.

Exemplary embodiments of cooling integrated circuit devices are described above in detail. The apparatus, systems, and methods are not limited to the specific embodiments described herein, but rather, operations of the methods and components of the systems may be utilized independently and separately from other operations or components described herein. For example, the systems, methods, and apparatus described herein may have other industrial or consumer applications and are not limited to practice with electronic components as described herein. Rather, one or more embodiments may be implemented and utilized in connection with other industries.

Although specific features of various embodiments of the invention may be shown in some drawings and not in others, this is for convenience only. In accordance with the principles of the invention, any feature of a drawing may be referenced or claimed in combination with any feature of any other drawing.

As used herein, an element or step recited in the singular and preceded with the word "a" or "an" should be understood as not excluding plural said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit device, comprising:
   a die substrate having a first surface and a second surface opposite the first surface, said die including at least one circuit element positioned on the first surface, wherein a junction region between said at least one circuit element and said first surface includes the first 100 microns of the die substrate;
   a plurality of micro-channels defined in the second surface, wherein each of said plurality of micro-channels is a groove defined in the die substrate and configured to circulate a cooling fluid therethrough and wherein at least one cross-sectional dimension of said plurality of micro-channels measures less than 1 millimeter and further wherein said plurality of micro-channels is defined at a distance less than 60 microns from the at least one circuit element;
   a cooling substrate coupled to the second surface forming a hermetic seal therebetween, said cooling substrate comprising:
      at least one fluid routing channel defined within said cooling substrate and coupled in flow communication with said plurality of micro-channels, wherein each of said plurality of micro-channels terminates above respective inlet channels and at said fluid routing channel; and
      at least one valve positioned within said at least one fluid routing channel, said at least one valve configured to autonomously regulate a flow rate of a cooling fluid therethrough.

2. The integrated circuit device in accordance with claim 1, wherein said plurality of micro-channels is positioned opposite the at least one circuit element positioned on the first surface.

3. The integrated circuit device in accordance with claim 1, wherein said plurality of micro-channels further comprises a plurality of parallel micro-channels.

4. The integrated circuit device in accordance with claim 1, wherein the material for said at least one valve comprises one or more shape memory alloys.

5. The integrated circuit device in accordance with claim 4, wherein the one or more shape memory alloys comprise nickel-titanium shape memory alloys.

6. The integrated circuit device in accordance with claim 1, further comprising a fluid circulation pump coupled in flow communication with said at least one fluid routing channel and coupled to said cooling substrate.

7. The integrated circuit device in accordance with claim 6, further comprising a heat exchanger including at least one cooling channel coupled in fluid communication with said at least one fluid routing channel and said fluid circulation pump.

8. A cooling system for an integrated circuit device, said cooling system comprising:
- a plurality of micro-channels defined in a die substrate comprising a first surface and a second surface opposite the first surface, said die including at least one circuit element positioned on the first surface, wherein a junction region between said at least one circuit element and said first surface includes the first 100 microns of the die substrate, wherein each of said plurality of micro-channels is a groove defined in the die substrate and configured to circulate a cooling fluid therethrough and wherein at least one cross-sectional dimension of said plurality of micro-channels measures less than 1 millimeter and further wherein said plurality of micro-channels is defined at a distance less than 60 microns from the at least one circuit element;
- a cooling substrate coupled to said die substrate forming a hermetic seal therebetween, said cooling substrate comprising:
  - at least one fluid routing channel defined within said cooling substrate and in flow communication with said plurality of micro-channels, wherein each of said plurality of micro-channels terminates above respective inlet channels and at said fluid routing channel; and
  - at least one temperature-responsive valve positioned within said at least one fluid routing channel, said at least one temperature-responsive valve configured to autonomously regulate a flow rate of a cooling fluid therethrough;
- a glass substrate coupled to said cooling substrate;
- a heat exchanger including at least one cooling channel in fluid communication with said at least one fluid routing channel, said heat exchanger coupled to said glass substrate; and
- a fluid circulation pump in flow communication with said heat exchanger and coupled to said cooling substrate.

9. The cooling system in accordance with claim 8, wherein said plurality of micro-channels, said at least one fluid routing channel, said fluid circulation pump, and said heat exchanger are coupled in a hermetically sealed closed-loop fluid circulation path.

10. The cooling system in accordance with claim 8, wherein said at least one temperature-responsive valve comprises a nickel-titanium shape memory alloy.

11. The cooling system in accordance with claim 8, wherein said at least one temperature-responsive valve is defined in a default partially opened curved position.

12. The cooling system in accordance with claim 8, wherein said at least one temperature-responsive valve is further configured to autonomously regulate the flow rate of a cooling fluid by actuating in response to temperature changes of the cooling fluid.

13. The cooling system in accordance with claim 8, further comprising at least one inlet channel defined within said cooling substrate and in flow communication with said plurality of micro-channels.

14. The cooling system in accordance with claim 13, further comprising an input manifold coupled in flow communication with said at least one inlet channel and said fluid circulation pump.

15. The cooling system in accordance with claim 14, further comprising an output manifold in flow communication with said at least one fluid routing channel and said heat exchanger.

* * * * *